(12) United States Patent
Chang et al.

(10) Patent No.: US 11,587,903 B2
(45) Date of Patent: Feb. 21, 2023

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Yung-Hsing Chang, Kaohsiung (TW); Wen-Hsin Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 25 days.

(21) Appl. No.: 15/960,416

(22) Filed: Apr. 23, 2018

(65) Prior Publication Data
US 2019/0326256 A1    Oct. 24, 2019

(51) Int. Cl.
| H01L 25/065 | (2006.01) |
| H01L 23/31 | (2006.01) |
| H01L 21/56 | (2006.01) |
| H01L 25/00 | (2006.01) |
| H01L 23/552 | (2006.01) |

(52) U.S. Cl.
CPC ........ *H01L 25/0652* (2013.01); *H01L 21/561* (2013.01); *H01L 23/3121* (2013.01); *H01L 23/552* (2013.01); *H01L 25/50* (2013.01)

(58) Field of Classification Search
CPC ... H01L 25/0652; H01L 25/50; H01L 21/651; H01L 23/3121; H01L 23/552
See application file for complete search history.

(56) References Cited

U.S. PATENT DOCUMENTS

| 7,875,499 B2 * | 1/2011 | Yamano | H01L 24/05 438/109 |
| 7,939,901 B2 * | 5/2011 | Minamio | B29C 45/14418 257/433 |
| 9,190,367 B1 * | 11/2015 | Liao | H01L 24/97 |
| 2002/0089069 A1 * | 7/2002 | Lamson | H01L 23/4952 257/784 |
| 2004/0106229 A1 | 6/2004 | Jiang et al. | |
| 2007/0132089 A1 * | 6/2007 | Jiang | H01L 24/49 257/700 |
| 2012/0228751 A1 * | 9/2012 | Song | H01L 23/585 257/660 |
| 2013/0032952 A1 * | 2/2013 | Cho | H01L 21/561 257/777 |

(Continued)

FOREIGN PATENT DOCUMENTS

JP    2001177009 A  *  6/2001

*Primary Examiner* — Dale E Page
*Assistant Examiner* — Quovaunda Jefferson
(74) *Attorney, Agent, or Firm* — Foley & Lardner LLP

(57) ABSTRACT

At least some embodiments of the present disclosure relate to a semiconductor device package. The semiconductor device package includes a first substrate with a first surface and a second surface opposite to the first surface, a second substrate adjacent to the first surface of the first substrate, and an encapsulant encapsulating the first substrate and the second substrate. The first substrate defines a space. The second substrate covers the space. The second surface of the first substrate is exposed by the encapsulant. A surface of the encapsulant is coplanar with the second surface of the first substrate or protrudes beyond the second surface of the first substrate.

13 Claims, 13 Drawing Sheets

(56) References Cited

U.S. PATENT DOCUMENTS

2014/0048913 A1* 2/2014 Park .................. H01L 23/3128
257/659
2017/0294407 A1* 10/2017 Kim ................... H01L 25/0652

* cited by examiner

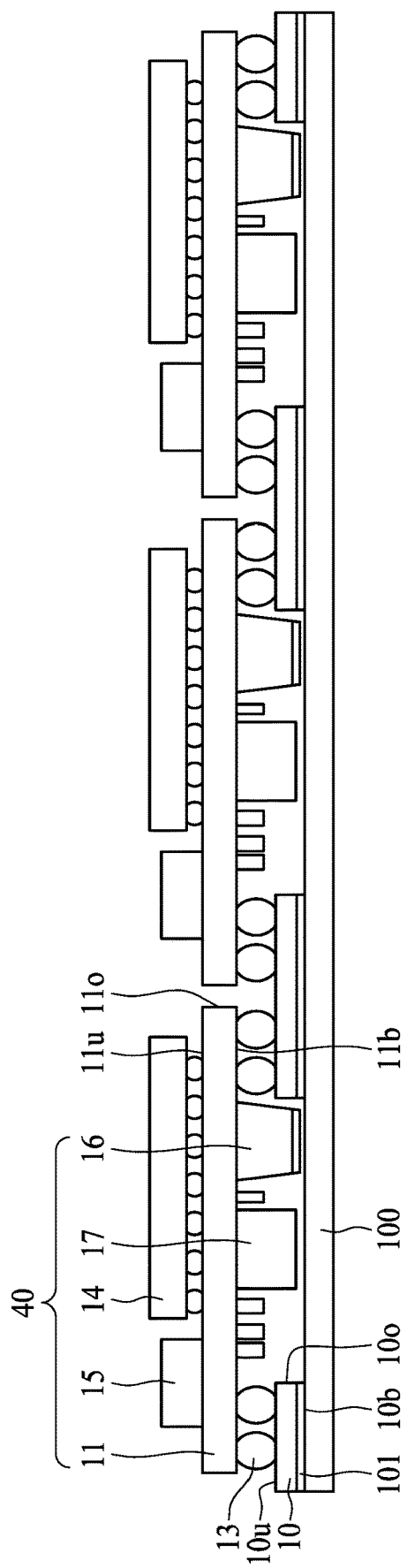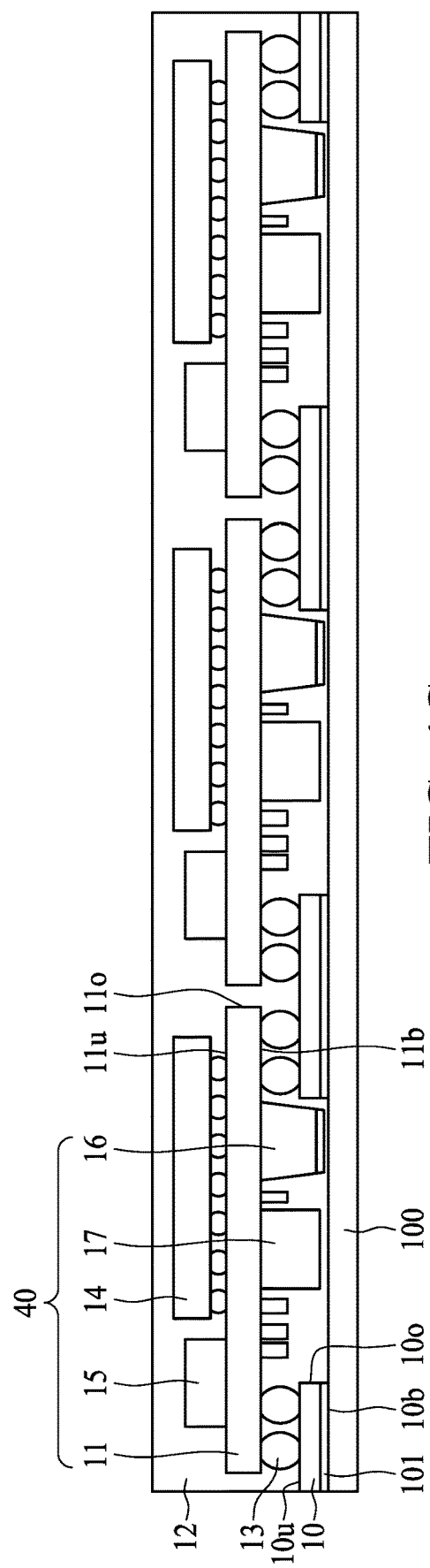

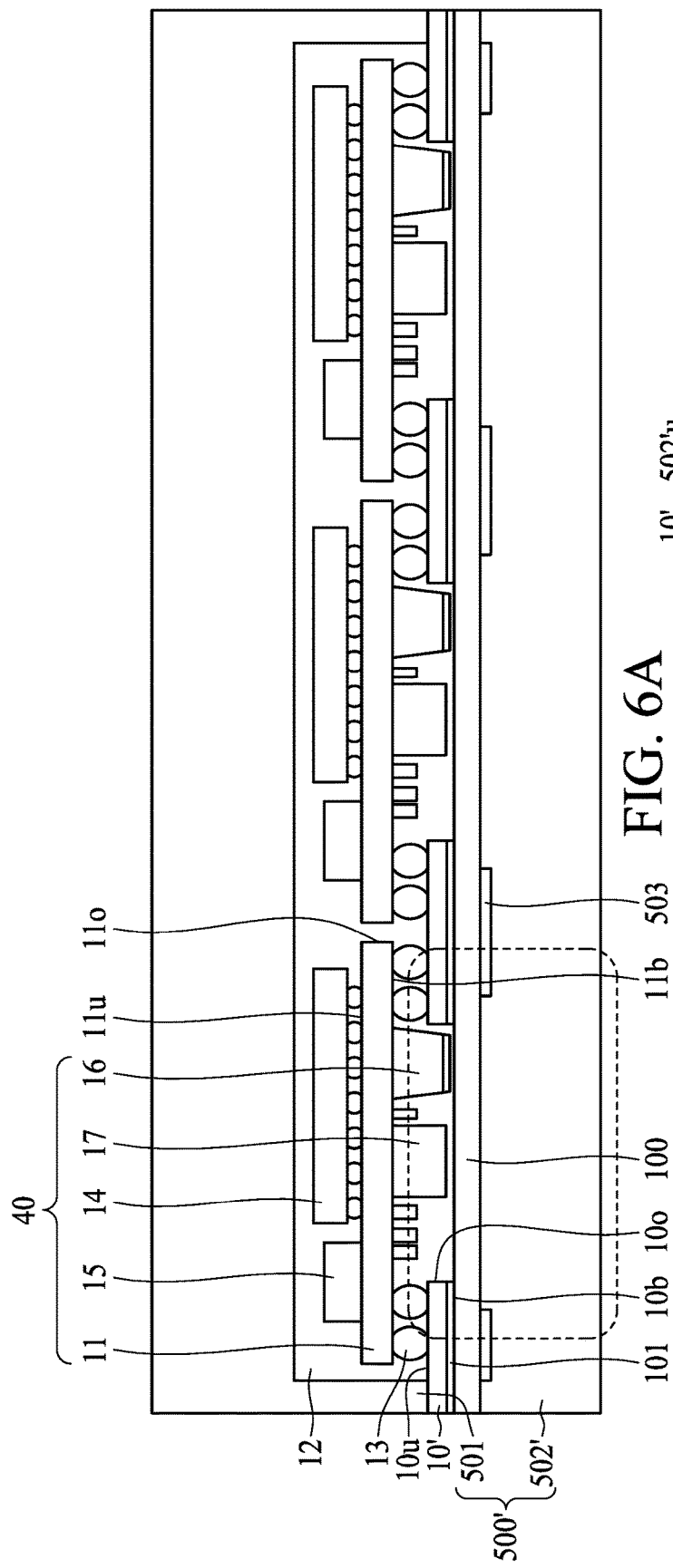
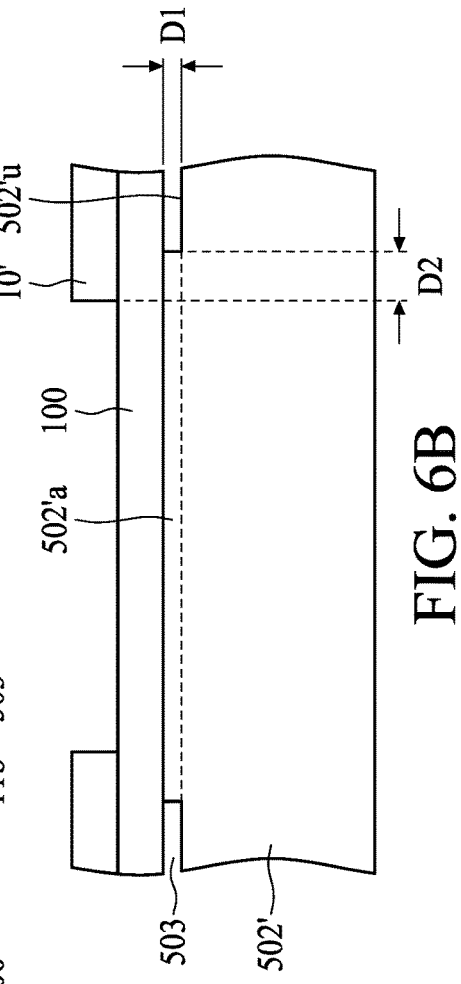
FIG. 6A
FIG. 6B

SEMICONDUCTOR DEVICE PACKAGE AND A METHOD OF MANUFACTURING THE SAME

BACKGROUND

1. Technical Field

The present disclosure relates to a semiconductor device package including a first substrate, a second substrate, and an encapsulant.

2. Description of the Related Art

To improve performance of a semiconductor device package, electronic components or semiconductor devices can be disposed on both sides of a substrate. A frame board, which may surround some components or semiconductor devices, is disposed on the substrate via connection elements (e.g. solder bumps). A multi-side molding technique may be used to encapsulate components or semiconductor devices on both sides of the substrate. Such a multi-side molding technique may involve two molding operations. During the molding operations, the connection elements to connect the frame board to the substrate may be deformed or damaged, which may adversely affect the performance of the semiconductor device package.

SUMMARY

In some embodiments, according to one aspect, a semiconductor device package includes a first substrate with a first surface and a second surface opposite to the first surface, a second substrate adjacent to the first surface of the first substrate, and an encapsulant encapsulating the first substrate and the second substrate. The first substrate defines a space. The second substrate covers the space. The second surface of the first substrate is exposed by the encapsulant. A surface of the encapsulant is coplanar with the second surface of the first substrate or protrudes beyond the second surface of the first substrate.

In some embodiments, according to another aspect, a semiconductor device package includes a first substrate with a surface, a second substrate adjacent to the first substrate, an encapsulant encapsulating the second substrate, and a conductive layer disposed on the encapsulant and the surface of the first substrate. The first substrate includes a grounding layer exposed from the surface. The first substrate defines a space. The second substrate covers the space. The encapsulant fills the space. The conductive layer is in contact with the grounding layer.

In some embodiments, according to another aspect, a semiconductor device package includes a first substrate defining a space, a second substrate adjacent to the first substrate and covering the space, a first electronic component, a second electronic component, and an encapsulant. The second substrate has a first surface, a second surface opposite to the first surface and a third surface extending from the first surface to the second surface. The first electronic component is disposed on the first surface of the second substrate. The second electronic component is disposed on the second surface of the second substrate and in the space of the first substrate. The encapsulant has a surface and encapsulates the first substrate, the second substrate, the first electronic component, and the second electronic component. The third surface of the second substrate is offset from the surface of the encapsulant by a non-zero distance.

In some embodiments, according to another aspect, a method for manufacturing a semiconductor device package includes: providing a first substrate with a first surface and a second surface opposite to the first surface, the first substrate defining a plurality of spaces; disposing an adhesive layer on the second surface of the first substrate; providing a semiconductor device module on the first surface of the first substrate; and encapsulating the first substrate and the semiconductor device module with an encapsulant.

BRIEF DESCRIPTION OF THE DRAWINGS

FIG. 4B illustrates a method of manufacturing a semiconductor device package according to some embodiments of the present disclosure.

FIG. 4C illustrates a method of manufacturing a semiconductor device package according to some embodiments of the present disclosure.

FIG. 6A illustrates a cross-sectional view of a semiconductor device package according to some embodiments of the present disclosure.

FIG. 6B illustrates a cross-sectional view of a semiconductor device package according to some embodiments of the present disclosure.

DETAILED DESCRIPTION

Figure 1:
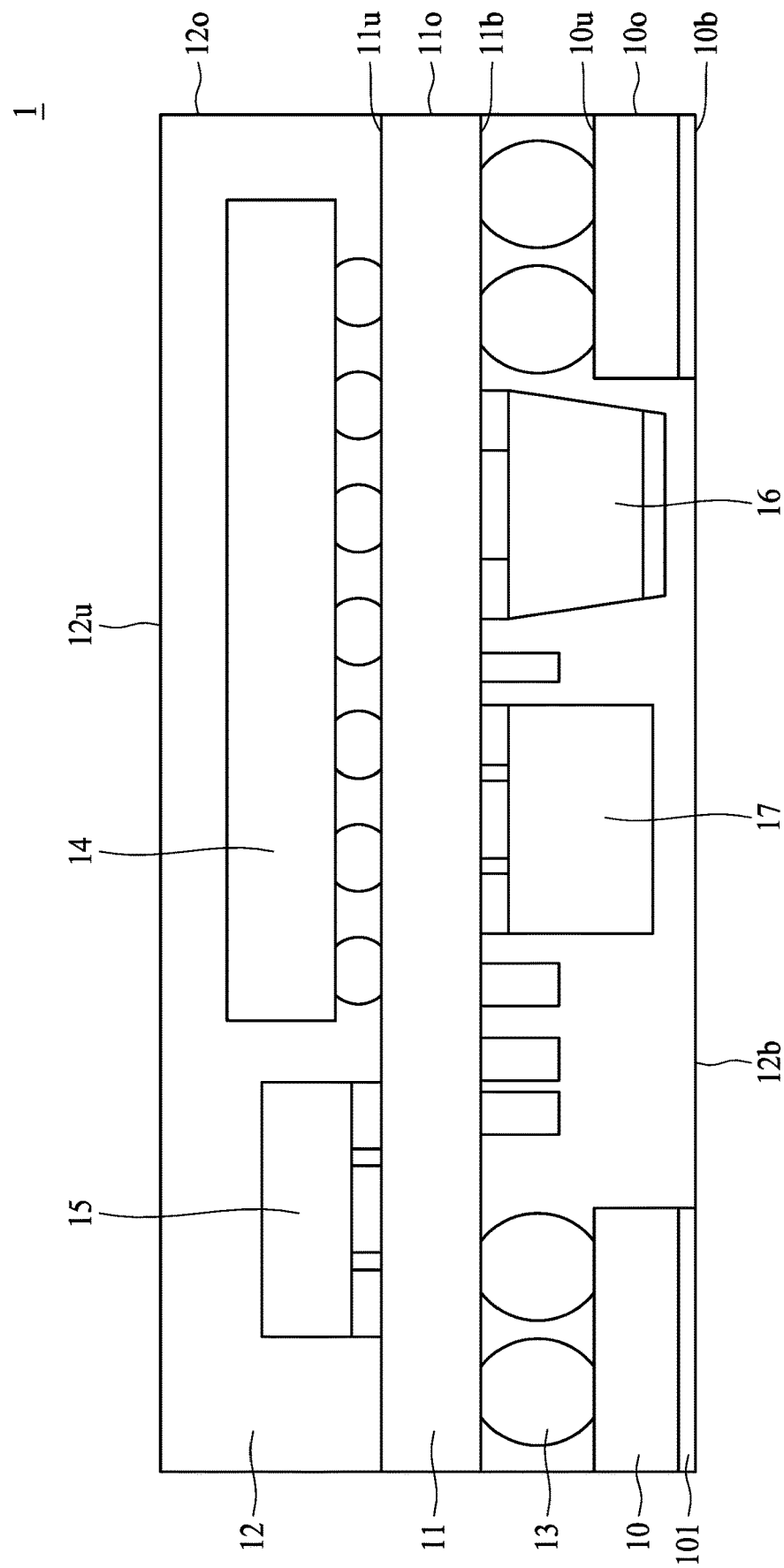
FIG. 1 illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a cross-sectional view of a semiconductor device package 1 in accordance with some embodiments of the present disclosure. The semiconductor device package 1 includes a substrate 10, a substrate 11, an encapsulant 12, a connection element 13, and electronic components (e.g. semiconductor devices) 14, 15, 16, 17.

The substrate 11 has an upper surface 11$u$, an outer/lateral surface 11$o$, and a lower surface 11$b$. The outer surface 11$o$ of the substrate 11 extends from the upper surface 11$u$ to the lower surface 11$b$. In some embodiments, the substrate 11 may include a main board. The electronic components 14 and 15 are disposed on the upper surface 11$u$ of the substrate 11. The electronic components 16 and 17 are disposed on the lower surface 11$b$ of the substrate 11. The electronic components 14, 15, 16, or 17 may constitute at least a portion of a flip chip package, a wire-bond package, or both. The electronic components 14, 15, 16, and 17 may be passive devices (including, for example, a capacitor) and/or active devices (including, for example, a semiconductor die).

The substrate 10 has an upper surface 10$u$, an outer/lateral surface 10$o$, and a lower surface 10$b$. The outer surface 10$o$ of the substrate 10 extends from the upper surface 10$u$ to the lower surface 10$b$. The outer surface 10$o$ of the substrate 10 and the outer surface 11$o$ of the substrate 11 are coplanar. In some embodiments, the substrate 10 may include a frame board. The substrate 10 may include a dielectric layer 101. The substrate 10 may include a conductive pad surrounded by the dielectric layer 101. In some embodiments, the dielectric layer 101 may be a solder resist layer. The dielectric layer 101 may be omitted. The substrate 10 is adjacent to the substrate 11. The substrate 10 is electrically connected to the substrate 11 via the connection element 13. The connection element 13 may be a solder bump. The substrate 10 defines a space (or an opening) or a plurality of spaces (or a plurality of openings). The electronic components 16 and 17 are disposed at least partially in the space of the substrate 10. The substrate 11 covers the space.

The encapsulant 12 (which may include a molding compound) has an upper surface 12$u$, an outer/lateral surface 12$o$, and a lower surface 12$b$. The outer surface 12$o$ of the encapsulant 12 may extend from the upper surface 12$u$ to the lower surface 12$b$ (e.g. may extend around a side of the substrate 11, not shown). The encapsulant 12 encapsulates the substrate 10 and the substrate 11. The encapsulant 12 encapsulates the electronic components 14, 15, 16, 17. The outer surface 10$o$ of the substrate 10, the outer surface 11$o$ of the substrate 11, and the outer surface 12$o$ of the encapsulant 12 are coplanar. The lower surface 10$b$ of the substrate 10 and the lower surface 12$b$ of the encapsulant 12 are coplanar. The lower surface 10$b$ of the substrate 10 is exposed by the encapsulant 12. In some embodiments, the encapsulant 12 may completely encapsulate the substrate 11. In such an embodiment, the outer surface 11$o$ of the substrate 11 may be completely covered by the encapsulant 12.

Figure 2A:
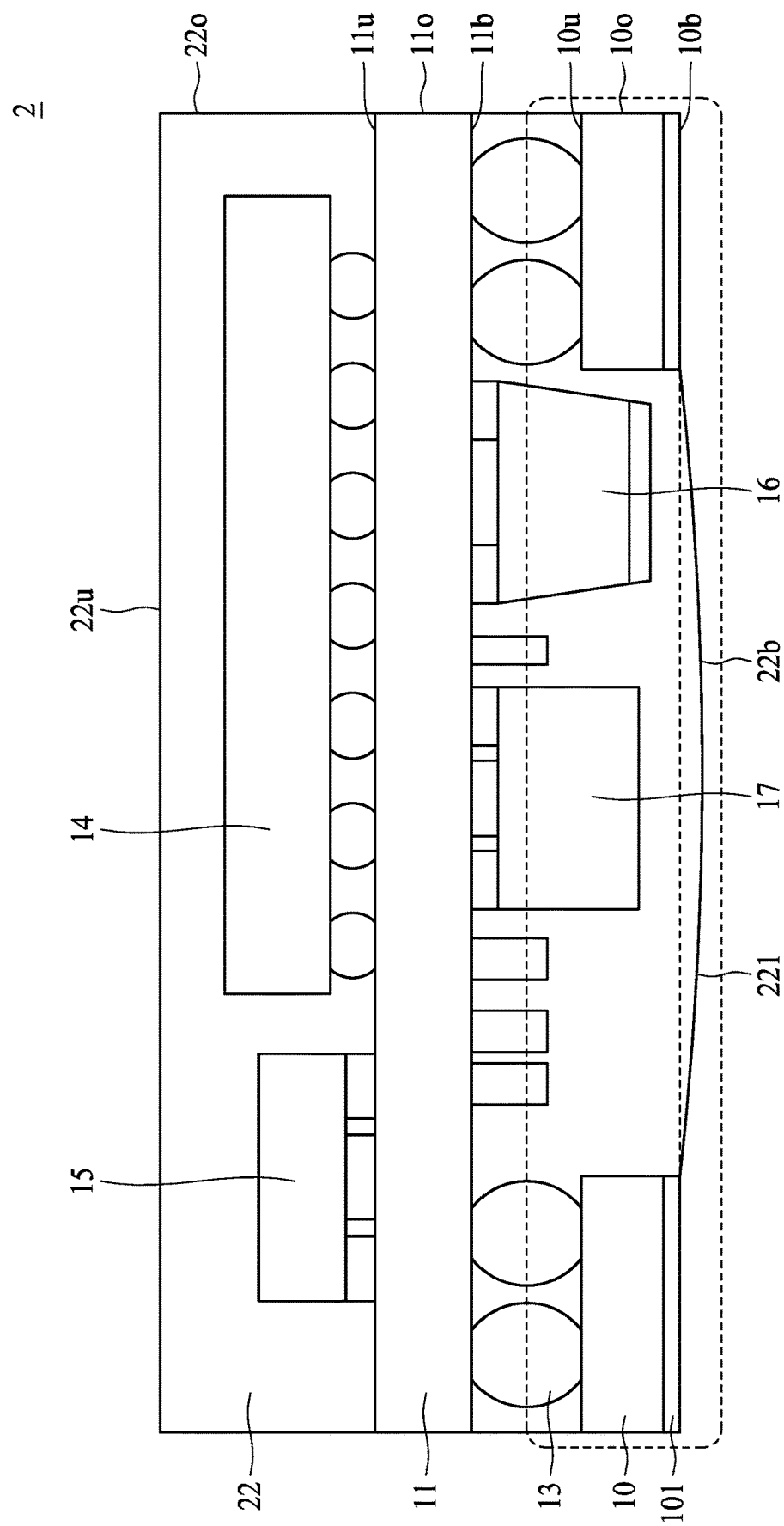
FIG. 2A illustrates a cross-sectional view of a semiconductor device package according to some embodiments of the present disclosure.

FIG. 2A is a cross-sectional view of a semiconductor device package 2 in accordance with some embodiments of the present disclosure. The semiconductor device package 2 includes a substrate 10, a substrate 11, an encapsulant 22, a connection element 13, and electronic components 14, 15, 16, 17.

The substrate 11 has an upper surface 11$u$, an outer/lateral surface 11$o$, and a lower surface 11$b$. The outer surface 11$o$ of the substrate 11 extends from the upper surface 11$u$ to the lower surface 11$b$. In some embodiments, the substrate 11 includes a main board. The electronic components 14 and 15 are disposed on the upper surface 11$u$ of the substrate 11. The electronic components 16 and 17 are disposed on the lower surface 11$b$ of the substrate 11.

The substrate 10 has an upper surface 10$u$, an outer/lateral surface 10$o$, and a lower surface 10$b$. The outer surface 10$o$ of the substrate 10 extends from the upper surface 10$u$ to the lower surface 10$b$. The outer surface 10$o$ of the substrate 10 and the outer surface 11$o$ of the substrate 11 are coplanar. The substrate 10 may include a dielectric layer 101. The dielectric layer 101 is adjacent to the lower surface 10$b$. The substrate 10 may include a conductive pad surrounded by the dielectric layer 101. In some embodiments, the dielectric layer 101 may be a solder resist layer. The dielectric layer 101 may be omitted. The substrate 10 is adjacent to the substrate 11. The substrate 10 is electrically connected to the substrate 11 via the connection element 13. The substrate 10 defines a space. The electronic components 16 and 17 are disposed in the space of the substrate 10. The substrate 11 covers the space. The substrate 10 extends horizontally.

The encapsulant 22 has an upper surface 22$u$, an outer/lateral surface 22$o$, and a lower surface 22$b$. The outer surface 22$o$ of the encapsulant 22 may extend from the upper surface 22$u$ to the lower surface 22$b$ (e.g. may extend around a side of the substrate 11, not shown). The encapsulant 22 encapsulates the substrate 10 and the substrate 11. The encapsulant 22 encapsulates the electronic components 14, 15, 16, 17. The outer surface 10$o$ of the substrate 10, the outer surface 11$o$ of the substrate 11, and the outer surface 22$o$ of the encapsulant 22 are coplanar. The lower surface 10$b$ of the substrate 10 is exposed by the encapsulant 22. In some embodiments, the encapsulant 22 may completely encapsulate the substrate 11. In such an embodiment, the outer surface 11$o$ of the substrate 11 may be completely covered by the encapsulant 22.

The encapsulant 22 includes a portion 221. The portion 221 protrudes below (or beyond) the substrate 10. The portion 221 protrudes below the dielectric layer 101 of the substrate 10. The lower surface 22$b$ of the encapsulant 22 is a surface of the portion 221 and protrudes below the surface 10$b$ of the substrate 10. The encapsulant 22 may substantially fill the space defined by the substrate 10.

Figure 2B:
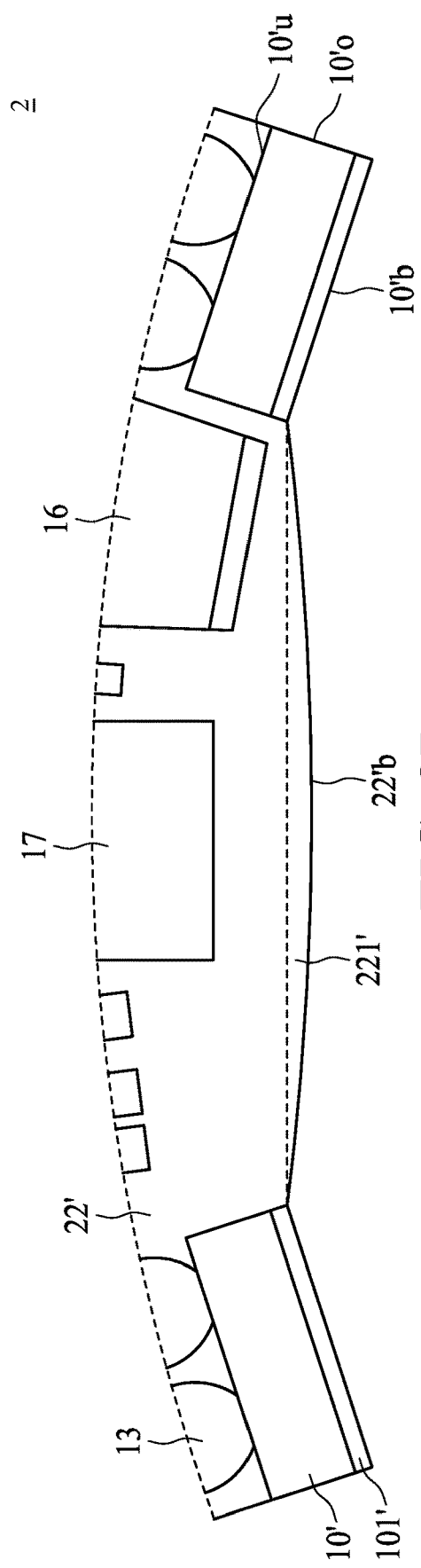
FIG. 2B illustrates a cross-sectional view of a semiconductor device package according to some embodiments of the present disclosure.

FIG. 2B is a cross-sectional view of a semiconductor device package 2 including a substrate 10' and an encapsulant 22' in accordance with some embodiments of the present disclosure, and shows an enlarged view of a region delimited by a dashed line in FIG. 2A.

The substrate 10' has an upper surface 10'$u$, an outer/lateral surface 10'$o$, and a lower surface 10'$b$. The substrate 10' includes a dielectric layer 101'. The dielectric layer 101' may be a solder resist layer. The substrate 10' defines a space. Electronic components 16 and 17 are disposed in the space of the substrate 10'.

The substrate 10' is slightly inclined (e.g. relative to a central portion of the semiconductor device package 2, and/or relative to a centrally located electronic component, such as the electronic component 17). A central portion of the substrate 10' is higher than a peripheral portion of the substrate 10' (e.g. the central portion of the substrate 10' is closer to the substrate 11 than is a peripheral portion of the substrate 10'). An inner lateral surface of the substrate 10' may be higher than the outer lateral surface 10'o, The substrate 10' is encapsulated by the encapsulant 22'. The encapsulant 22' includes a portion 221' having a lower surface 22'b. The portion 221' protrudes below at least a portion of the substrate 10'. The portion 221' protrudes below at least a portion of the dielectric layer 101' of the substrate 10'. The lower surface 22'b of the portion 221' protrudes below at least a portion of the surface 10'b of the substrate 10'. A central portion of the lower surface 22'b may protrude further than does an outer portion of the lower surface 22'b.

Figure 2C:
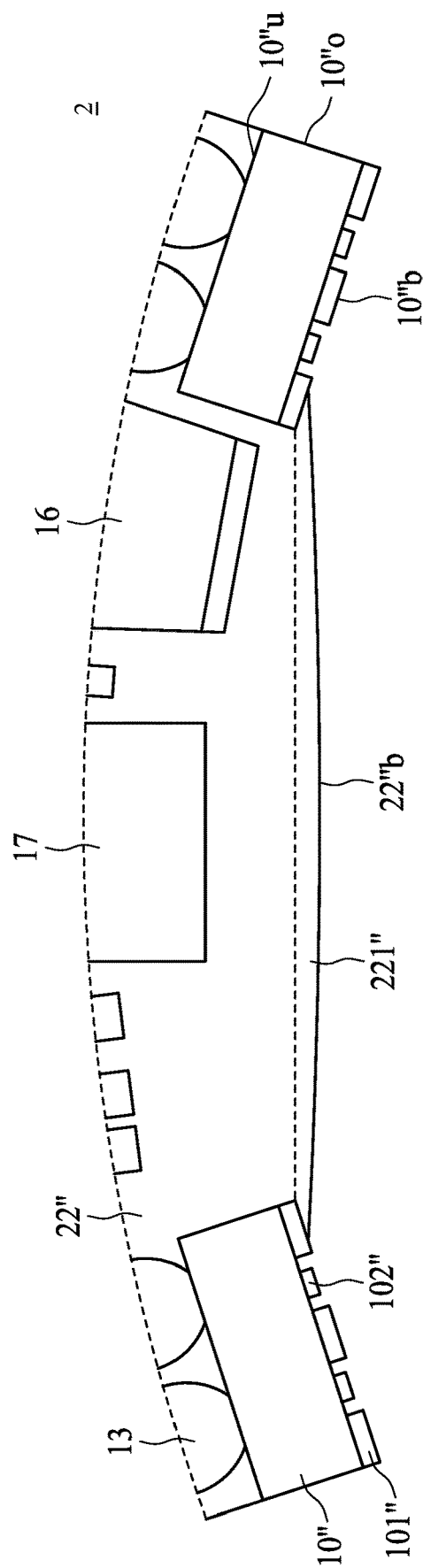
FIG. 2C illustrates a cross-sectional view of a semiconductor device package according to some embodiments of the present disclosure.

FIG. 2C is a cross-sectional view of the semiconductor device package 2 including a substrate 10" and an encapsulant 22" in accordance with some embodiments of the present disclosure, and shows an enlarged view of a region delimited by a dashed line in FIG. 2A.

The substrate 10" has an upper surface 10"u, an outer/lateral surface 10"o, and a lower surface 10"b. The substrate 10" includes a dielectric layer 101" and a conductive pad 102". The dielectric layer 101" may be a solder resist layer. The dielectric layer 101" surrounds the conductive pad 102". The substrate 10" defines a space. Electronic components 16 and 17 are disposed in the space of the substrate 10".

The substrate 10" is slightly inclined (e.g. relative to a central portion of the semiconductor device package 2, and/or relative to a centrally located electronic component, such as the electronic component 17). A central portion of the substrate 10" is higher than a peripheral portion of the substrate 10" (e.g. the central portion of the substrate 10" is closer to the substrate 11 than is a peripheral portion of the substrate 10"). An inner lateral surface of the substrate 10" may be higher than the outer lateral surface 10"o, The substrate 10" is encapsulated by the encapsulant 22". The encapsulant 22" includes a portion 221" having a lower surface 22"b. The portion 221" protrudes below at least a portion of the substrate 10". The portion 221" protrudes below at least a portion of the dielectric layer 101" of the substrate 10". The lower surface 22"b of the portion 221" protrudes below at least a portion of the surface 10"b of the substrate 10". The portion 221" covers a portion of the substrate 10". The portion 221" partially covers the lower surface 10"b of the substrate 10". The portion 221" partially covers a portion of the dielectric layer 101". The portion 221" and the conductive pad 102" on the substrate 10" are spaced by a distance. In some embodiments (not shown), a central portion of the lower surface 22"b may protrude further than does an outer portion of the lower surface 22"b.

Figure 3A:
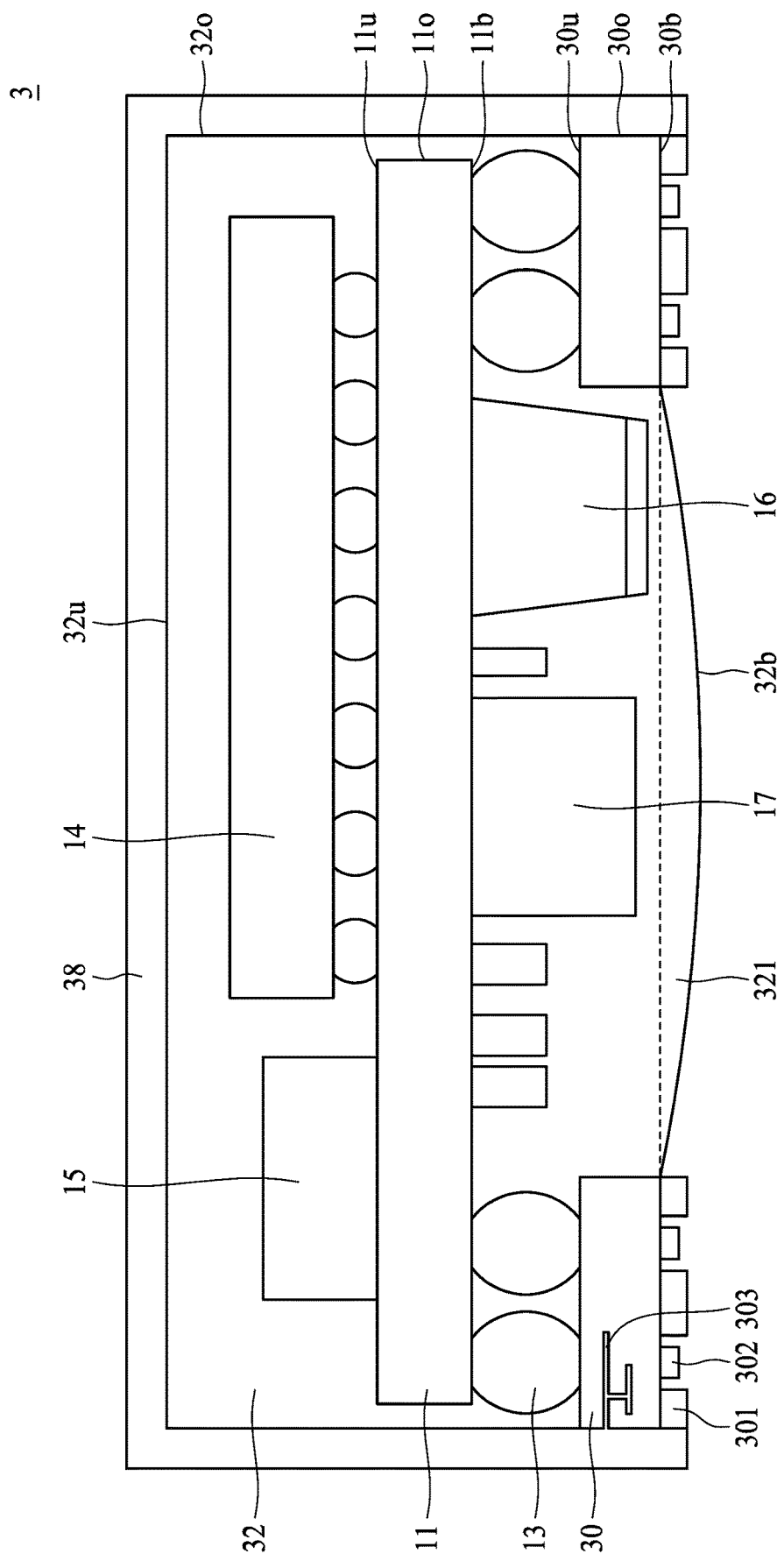
FIG. 3A illustrates a cross-sectional view of a semiconductor device package according to some embodiments of the present disclosure.

FIG. 3A is a cross-sectional view of a semiconductor device package 3 in accordance with some embodiments of the present disclosure. The semiconductor device package 3 includes a substrate 30, a substrate 11, an encapsulant 32, a connection element 13, electronic components 14, 15, 16, 17, and a conductive layer 38.

The substrate 11 has an upper surface 11u, an outer/lateral surface 11o, and a lower surface 11b. The outer surface 11o of the substrate 11 extends from the upper surface 11u to the lower surface 11b. In some embodiments, the substrate 11 may include a main board. The electronic components 14 and 15 are disposed on the upper surface 11u of the substrate 11. The electronic components 16 and 17 are disposed on the lower surface 11b of the substrate 11.

The substrate 30 has an upper surface 30u, an outer/lateral surface 30o, and a lower surface 30b. The outer surface 30o of the substrate 30 extends from the upper surface 30u to the lower surface 30b. The outer surface 30o of the substrate 30 and the outer surface 11o of the substrate 11 (which are substantially parallel to one another) are offset from each other, and are not coplanar. In some embodiments, the substrate 30 may include a frame board. The substrate 30 may include a dielectric layer 301, a conductive pad 302, and a conductive layer 303. In some embodiments, the conductive pad 302 may be replaced with a solder bump. The conductive pad 302 is surrounded by the dielectric layer 301. In some embodiments, the dielectric layer 301 may be a solder resist layer. The dielectric layer 301 may be omitted. The conductive layer 303 may be a grounding layer. The conductive layer 303 is exposed from the outer surface 30o. The substrate 30 is adjacent to the substrate 11. The substrate 30 is electrically connected to the substrate 11 via the connection element 13. The substrate 30 defines a space. The electronic components 16 and 17 are disposed in the space of the substrate 30. The substrate 11 covers the space.

The encapsulant 32 has an upper surface 32u, an outer/lateral surface 32o, and a lower surface 32b. The encapsulant 32 encapsulates the substrate 30 and the substrate 11. The encapsulant 32 encapsulates the electronic components 14, 15, 16, 17. The outer surface 30o of the substrate 30 and the outer surface 32o of the encapsulant 32 are coplanar. The lower surface 30b of the substrate 30 is exposed by the encapsulant 32. The encapsulant 32 completely encapsulates the substrate 11. The outer surface 11o of the substrate 11 is completely covered by the encapsulant 32. The outer surface 11o of the substrate 11 is spaced from the outer surface 32o of the encapsulant 32 by a non-zero distance. The outer surface 11o of the substrate 11 and the outer surface 32o of the encapsulant 32 (which are substantially parallel to one another) are offset from each other, and are not coplanar.

The encapsulant 32 includes a portion 321. The portion 321 protrudes below the substrate 30. The portion 321 protrudes below the dielectric layer 301 of the substrate 30. The lower surface 32b of the portion 321 protrudes below the surface 30b of the substrate 30.

The conductive layer 38 is disposed on the encapsulant 32 and the outer surface 30o of the substrate 30. The conductive layer 38 is in contact with the conductive layer 303. In some embodiments, the conductive layer 38 may be a shielding layer.

Figure 3B:
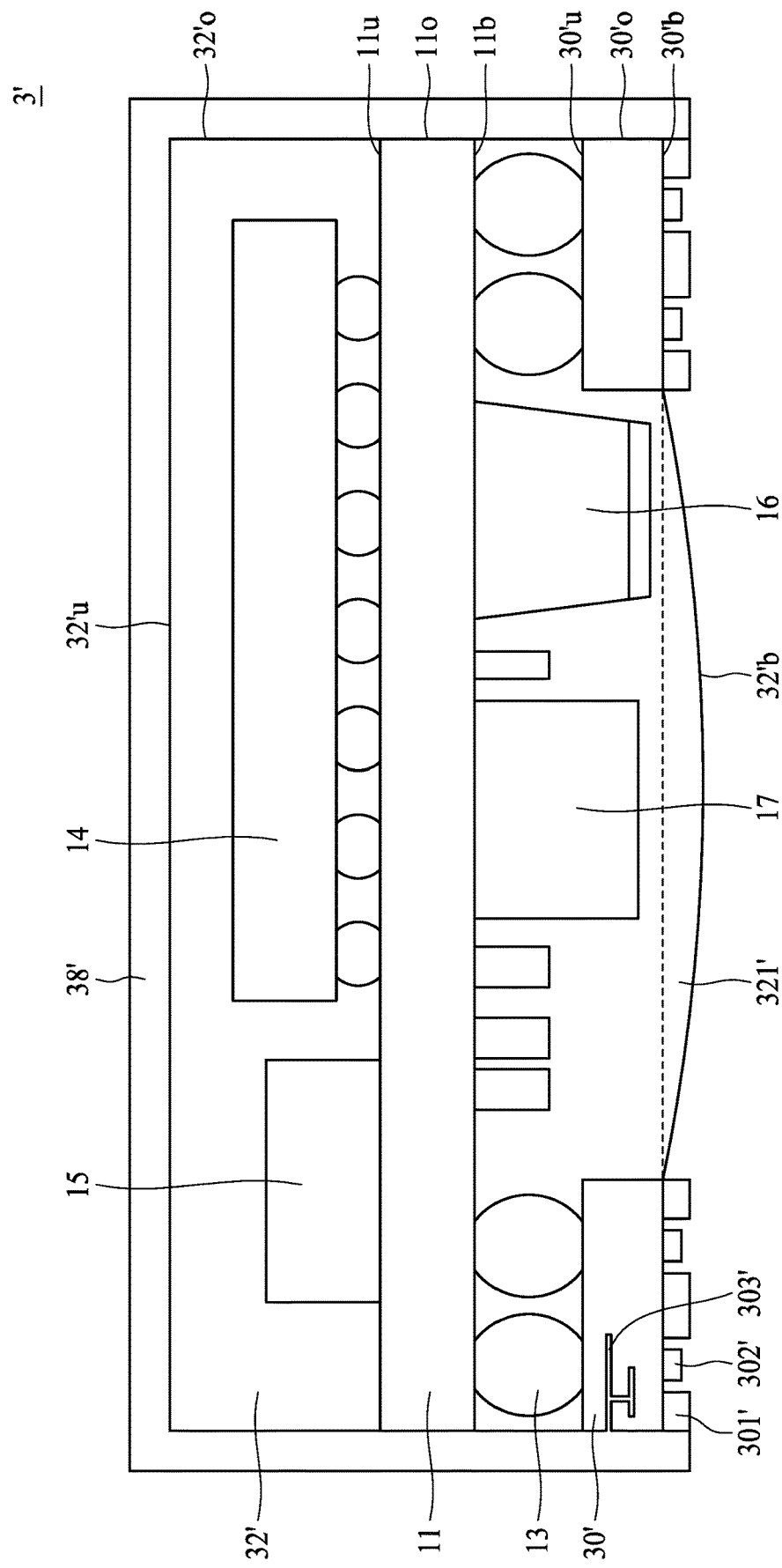
FIG. 3B illustrates a cross-sectional view of a semiconductor device package according to some embodiments of the present disclosure.

FIG. 3B is a cross-sectional view of a semiconductor device package 3' in accordance with some embodiments of the present disclosure. The semiconductor device package 3' includes a substrate 30', a substrate 11, an encapsulant 32', a connection element 13, electronic components 14, 15, 16, 17, and a conductive layer 38'.

The substrate 11 has an upper surface 11u, an outer/lateral surface 11o, and a lower surface 11b. The outer surface 11o of the substrate 11 extends from the upper surface 11u to the lower surface 11b. In some embodiments, the substrate 11 may include a main board. The electronic components 14 and 15 are disposed on the upper surface 11u of the substrate 11. The electronic components 16 and 17 are disposed on the lower surface 11b of the substrate 11.

The substrate 30' has an upper surface 30'u, an outer/lateral surface 30'o, and a lower surface 30'b. The outer surface 30'o of the substrate 30' and the outer surface 11o of the substrate 11 are coplanar. In some embodiments, the substrate 30 may include a frame board. The substrate 30' may include a dielectric layer 301', a conductive pad 302', and a conductive layer 303'. The conductive pad 302' is surrounded by the dielectric layer 301'. In some embodiments, the dielectric layer 301' may be a solder resist layer. The dielectric layer 301' may be omitted. The conductive layer 303' may be a grounding layer. The conductive layer 303' is exposed from the outer surface 30'o. The substrate 30' is adjacent to the substrate 11. The substrate 30' is electrically connected to the substrate 11 via the connection element 13. The substrate 30' defines a space. The electronic components 16 and 17 are disposed in the space of the substrate 30'. The substrate 11 covers the space. In some embodiments, the substrate 11 may include a grounding layer exposed from the outer surface 11o of the substrate 11. The conductive layer 38' may contact the grounding layer of the substrate 11 and may be electrically connected to the connection element 13.

The encapsulant 32' has an upper surface 32'u, an outer/lateral surface 32'o, and a lower surface 32'b. The encapsulant 32' encapsulates the substrate 30' and the substrate 11. The encapsulant 32' encapsulates the electronic components 14, 15, 16, 17. The outer surface 30'o of the substrate 30' and the outer surface 32'o of the encapsulant 32' are coplanar. The lower surface 30'b of the substrate 30' is exposed by the encapsulant 32'.

The encapsulant 32' includes a portion 321'. The portion 321' protrudes below the substrate 30'. The portion 321' protrudes below the dielectric layer 301' of the substrate 30'. The lower surface 32'b of the portion 321' protrudes below the surface 30'b of the substrate 30'.

The conductive layer 38' is disposed on the encapsulant 32' and the outer surface 30'o of the substrate 30'. The conductive layer 38' is in contact with the conductive layer 303'. The conductive layer 38' is in contact with the outer surface 11o of the substrate 11. In some embodiments, the conductive layer 38 may be a shielding layer.

FIG. 4A through FIG. 4D illustrate some embodiments of a method of manufacturing the semiconductor device package 1 according to some embodiments of the present disclosure. In some embodiments, a semiconductor device package 2 may be similarly manufactured by the depicted method.

Figure 4A:
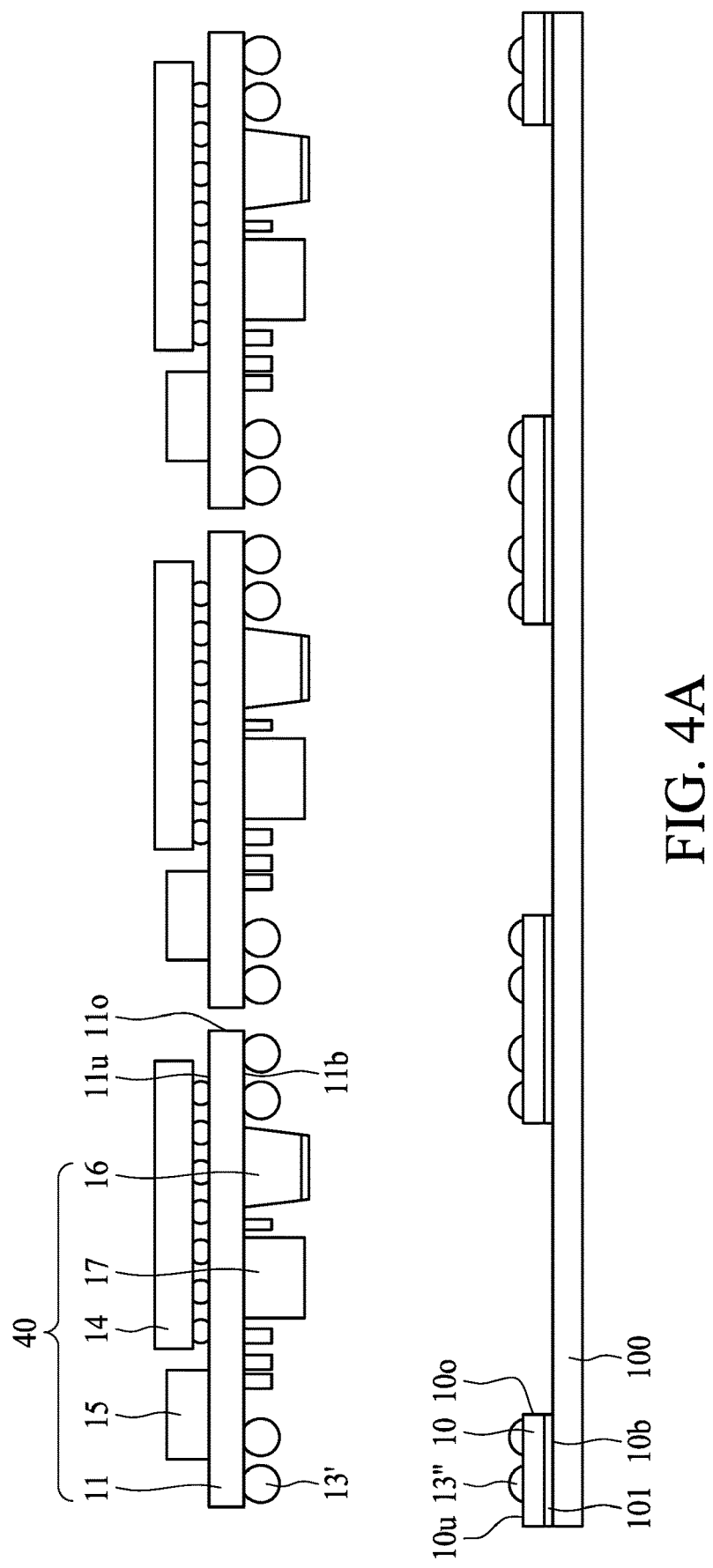
FIG. 4A illustrates a method of manufacturing a semiconductor device package according to some embodiments of the present disclosure.

Referring to FIG. 4A, a method for manufacturing the semiconductor device package 1 includes providing a substrate 10 with an upper surface 10u, an outer/lateral surface 10o, and a lower surface 10b opposite to the surface 10u. The substrate 10 may include a frame board. The substrate 10 comprises a strip or a panel. The substrate 10 includes a dielectric layer 101. The substrate 10 may include a conductive pad surrounded by the dielectric layer 101. In some embodiments, the dielectric layer 101 may be a solder resist layer. A connection element 13" is disposed on the upper surface 10u of the substrate 10. The connection element 13" may include a solder material.

An adhesive layer 100 is disposed on the lower surface 10b of the substrate 10. An individual semiconductor device module 40 is disposed on the upper surface 10u of the substrate 10. The semiconductor device module 40 includes a substrate 11 and electronic components 14, 15, 16, and 17. The substrate 11 may include a main board. The substrate 11 has an upper surface 11u, an outer/lateral surface 11o, and a lower surface 11b. Electronic components 14 and 15 are disposed on the upper surface 11u of the substrate 11. Electronic components 16 and 17 are disposed on the lower surface 11b of the substrate 11. A connection element 13' is disposed on the semiconductor device module 40. The connection element 13' may include a solder material.

In some embodiments, a strip or a panel of semiconductor device modules 40 is preprocessed by a singulation operation. The strip or a panel of semiconductor device modules 40 is divided into a plurality of units.

Referring to FIG. 4B, the semiconductor device module 40 is mounted on the substrate 10. The semiconductor device module 40 is electrically connected to the substrate 10 via a connection element 13 (e.g. a connection element formed from the connection element 13' and the connection element 13").

Referring to FIG. 4C, the substrate 10 and the semiconductor device module 40 is encapsulated by a one-time molding operation. The substrate 10 and the semiconductor device module 40 are encapsulated by an encapsulant 12. During the one-time molding operation, a carrier may be provided on the adhesive layer 100. The carrier covers the substrate 10, the adhesive layer 100, and the semiconductor device module 40. The carrier may be a mold chase. The one-time molding operation may significantly reduce costs of manufacturing of semiconductor device packages and increase throughputs (e.g. as compared to processes that involve more than a single molding operation).

Figure 4D:
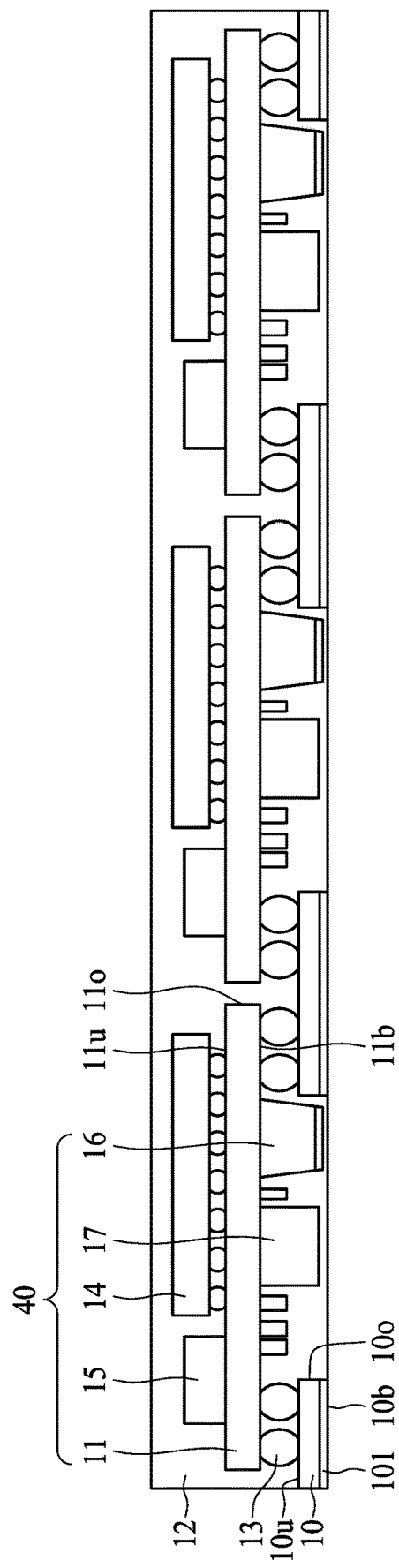
FIG. 4D illustrates a method of manufacturing a semiconductor device package according to some embodiments of the present disclosure.

Referring to FIG. 4D, the adhesive layer 100 is removed. Subsequently, a singulation operation is performed. During the singulation operation, the substrate 10 and the encapsulant 12 may be sawed. In some embodiments, the substrate 11 of the semiconductor device module 40 is sawed during the singulation operation.

Figure 5:
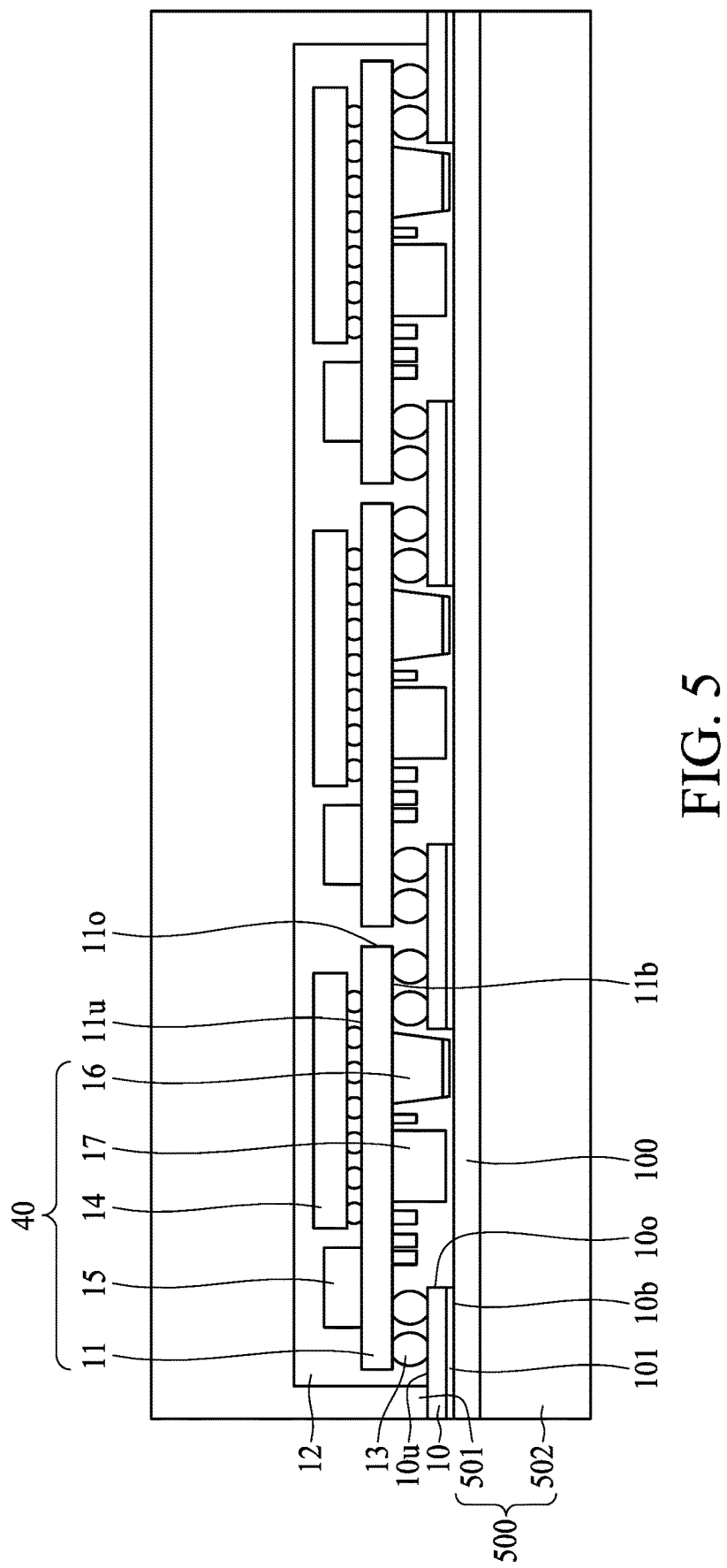
FIG. 5 illustrates a cross-sectional view of a semiconductor device package according to some embodiments of the present disclosure.

FIG. 5 is a cross-sectional view of a semiconductor device package molded in a carrier 500 according to some embodiments of the present disclosure. The carrier 500 is provided on the adhesive layer 100. The carrier 500 covers the substrate 10, the adhesive layer 100, and the semiconductor device module 40. The carrier 500 may be a mold chase.

The carrier 500 includes a portion 501 and a portion 502. The portion 501 presses on the substrate 10. The portion 502 presses on the adhesive layer 100. The substrate 10, the adhesive layer 100, and the semiconductor device module 40 are disposed between the portion 501 and the portion 502. The adhesive layer 100 is disposed between the substrate 10 and the portion 502. The portion 501 may not directly press or contact the semiconductor device module 40. The portion 501 may not directly press or contact the substrate 11 of the semiconductor device module 40. The substrate 10 and the semiconductor device module 40 are encapsulated in the carrier 500. Since the carrier 500 is disposed on the adhesive layer 100, the carrier 500 may directly press a periphery of the substrate 10 (e.g. on the surface 10u of the substrate 10), and may avoid directly pressing or contacting the substrate 11. This can help to ensure that the connection element 13 does not deform during the molding operation.

The semiconductor device package 1 or 2 may be manufactured using the carrier 500.

FIG. 6A is a cross-sectional view of a semiconductor device package molded in a carrier 500' according to some embodiments of the present disclosure. The carrier 500' is provided on an adhesive layer 100. The carrier 500' covers a substrate 10', the adhesive layer 100, and a semiconductor device module 40. The carrier 500' may be a mold chase.

The carrier 500' includes a portion 501 and a portion 502'. The portion 502' includes a protrusion 502'a (shown in FIG. 6B). The portion 501 presses on the substrate 10'. The portion 502' presses on the substrate 10' (e.g. via the adhesive layer 100). The substrate 10', the adhesive layer 100, and the semiconductor device module 40 are disposed between the portion 501 and the portion 502'. The adhesive layer 100 is disposed between the substrate 10' and the portion 502'. A space 503 is defined by two adjacent portions of the portion 502'. The space 503 is defined by the adhesive layer 100 and two adjacent portions of the portion 502'. The space 503 is located under the substrate 10'. The protrusion 502'a is located under an inner periphery of the substrate 10'. The protrusion 502'a correspondingly supports an inner peripheral portion of the substrate 10'. Since an injecting force of a molding operation may be very large, in some comparative implementations an injected encapsulant may flow or be pushed to a lower surface 10'b of the substrate 10' and may cover the lower surface 10'b (which may cause a disconnection issue). The design of the carrier 500' may help to prevent an encapsulant from flowing or being pushed to the lower surface 10'b of the substrate 10' and covering the lower surface 10'b.

FIG. 6B is a cross-sectional view of a carrier 500' according to some embodiments of the present disclosure, and shows an enlarged view of a region delimited by a dashed line in FIG. 6A. The protrusion 502'a of the carrier 500' supports an inner peripheral portion of the substrate 10', and may not fully support a central portion of the substrate 10'. Accordingly, the substrate 10' may slightly deform during the molding operation. The substrate 10' may be slightly inclined. A central portion of the substrate 10' may be higher than a peripheral portion of the substrate 10'.

A surface 502'u of the portion 502' and a lower surface of the adhesive layer 100 are spaced by a distance D1. The distance D1 is in a range from approximately 0.01 millimeters (mm) to approximately 0.02 mm. An outer surface of the protrusion 502'a and an inner surface of the substrate 10' are offset by a distance D2. The distance D2 is in a range from approximately 0.2 mm to approximately 0.25 mm.

According to the design of the carrier 500', the substrates 10' and 10" of FIG. 2B and FIG. 2C may be manufactured.

Figure 7:
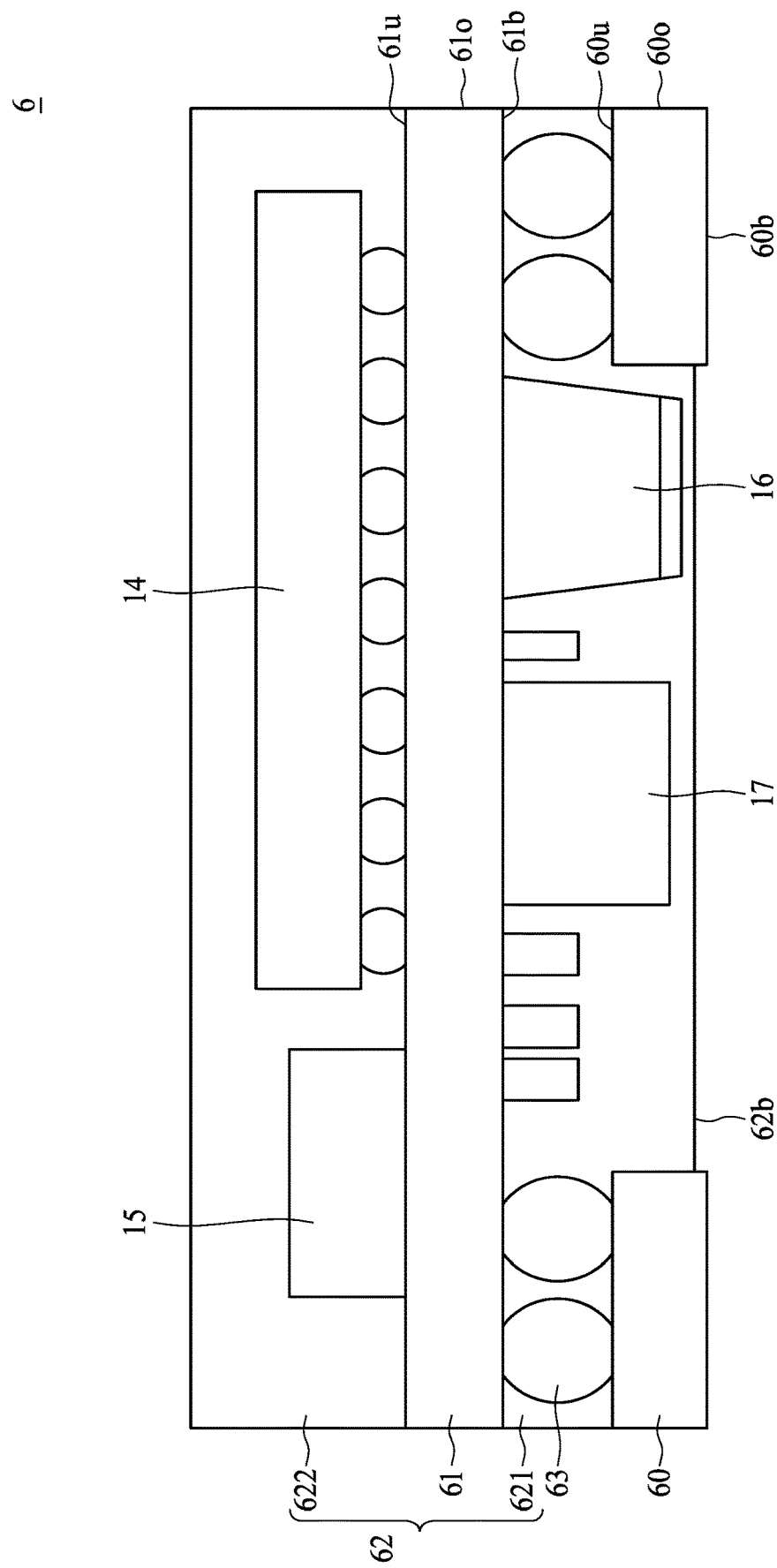
FIG. 7 illustrates a cross-sectional view of a comparative semiconductor device package.

FIG. 7 is a cross-sectional view of a comparative semiconductor device package 6. The semiconductor device package 6 includes a substrate 60, a substrate 61, an encapsulant 62, a connection element 63, and electronic components 14, 15, 16, 17.

The substrate 61 has an upper surface 61u, an outer/lateral surface 61o, and a lower surface 61b. The substrate 11 includes a main board. The electronic components 14 and 15 are disposed on the upper surface 61u of the substrate 61. The electronic components 16 and 17 are disposed on the lower surface 61b of the substrate 61.

The substrate 60 has an upper surface 60u, an outer/lateral surface 60o, and a lower surface 60b. The substrate 60 may include a frame board. The substrate 60 may include a solder resist layer and a conductive pad. The conductive pad is surrounded by the solder resist layer. The substrate 60 is adjacent to the substrate 61. The substrate 60 is electrically connected to the substrate 61 via the connection element 63. The connection element 63 is a solder bump. The substrate 60 defines a space. The electronic components 16 and 17 are disposed in the space of the substrate 60. The substrate 61 covers the space.

The encapsulant 62 has an upper surface 62u, an outer/lateral surface 62o, and a lower surface 62b. The encapsulant includes a portion 621 and a portion 622. The encapsulant 62 encapsulates the substrate 60 and the substrate 61. The encapsulant 12 encapsulates the electronic components 14, 15, 16, 17. The lower surface 60b of the substrate 10 is lower than the lower surface 62b of the encapsulant 62. The lower surface 60b of the substrate 60 is exposed by the encapsulant 62. Part of an inner peripheral surface of the substrate 60 is exposed by the encapsulant 62.

FIG. 8A through FIG. 8D illustrate some embodiments of a method of manufacturing the semiconductor device package 6.

Figure 8A:
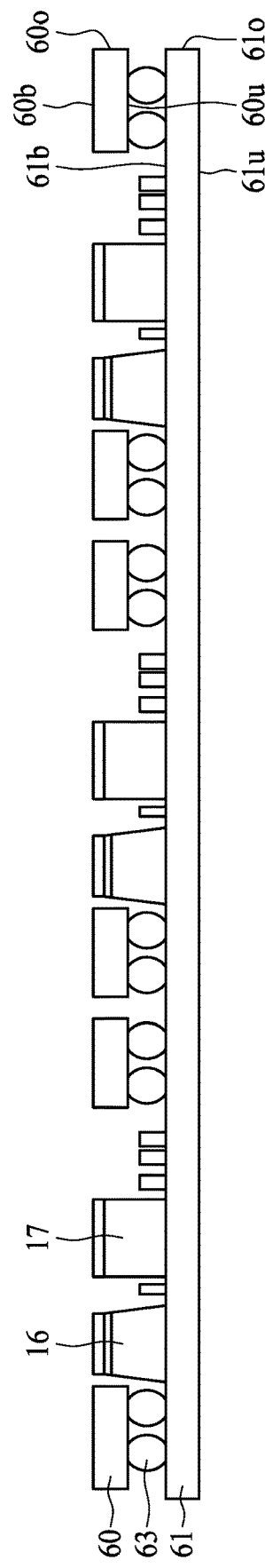
FIG. 8A illustrates a method of manufacturing a comparative semiconductor device package.

Referring to FIG. 8A, a method for manufacturing the semiconductor device package 6 includes providing a substrate 61 with an upper surface 61u, an outer/lateral surface 61o, and a lower surface 61b opposite to the surface 61u. The substrate 61 comprises a strip or a panel. A substrate 60 is provided on the substrate 61. The substrate 60 has an upper surface 60u, an outer/lateral surface 60o, and a lower surface 60b opposite to the surface 60u. The substrate 60 is mounted on the lower surface 61b of the substrate 61 via the connection element 63. The substrate 60 comprises a strip or a panel. Electronic components 16 and 17 are disposed on the lower surface 61b of the substrate 61.

Figure 8B:
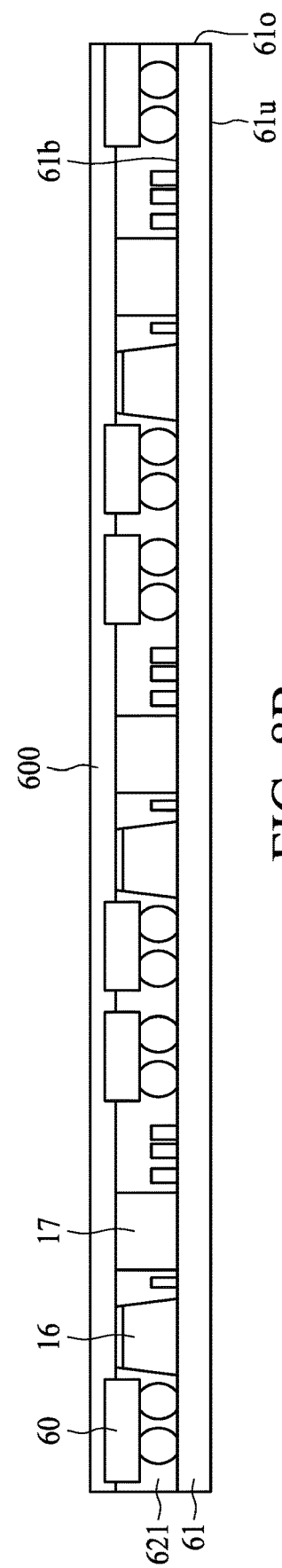
FIG. 8B illustrates a method of manufacturing a comparative semiconductor device package.

Referring to FIG. 8B, an adhesive layer 600 is provided on the substrate 60 and subsequently, a first molding operation is performed. During the first molding operation, a mold chase may directly press the substrate 61 and the adhesive layer 600. The substrate 60, the substrate 61, and the electronic components 16 and 17 are encapsulated by an encapsulant 621. Since the mold chase would directly press the substrate 61 and the adhesive layer 600 during the first molding operation, the lower surface 60b of the substrate 60 and a lower surface of encapsulant 621 are not coplanar.

Furthermore, since the substrate 61 is pressed by the mold chase, the connection element 63 may deform by the pressure from the mold chase. The deformation of the connection element 63 may cause a delamination between the connection element 63 and the encapsulant 621.

Figure 8C:
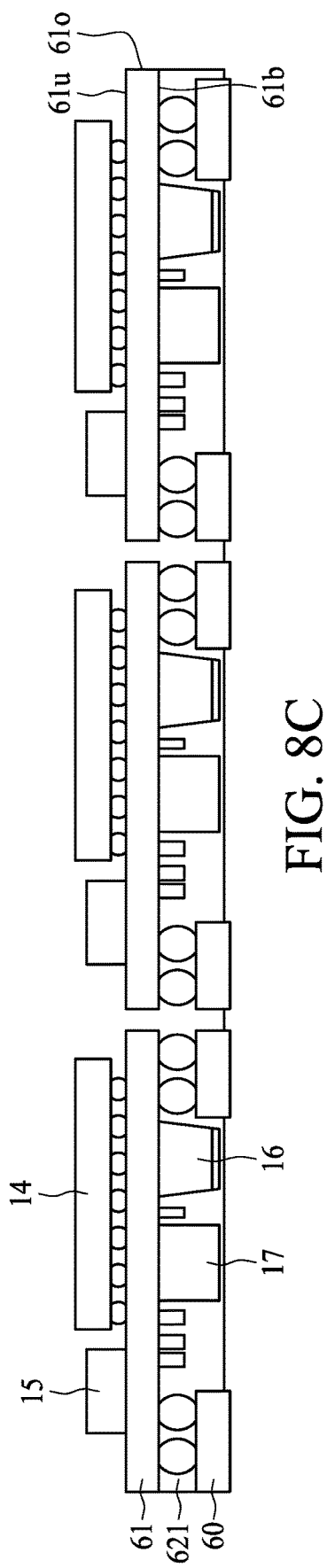
FIG. 8C illustrates a method of manufacturing a comparative semiconductor device package.

Referring to FIG. 8C, electronic components 14 and 15 are disposed on the upper surface 61u of the substrate 61. The adhesive layer 600 is removed.

Figure 8D:
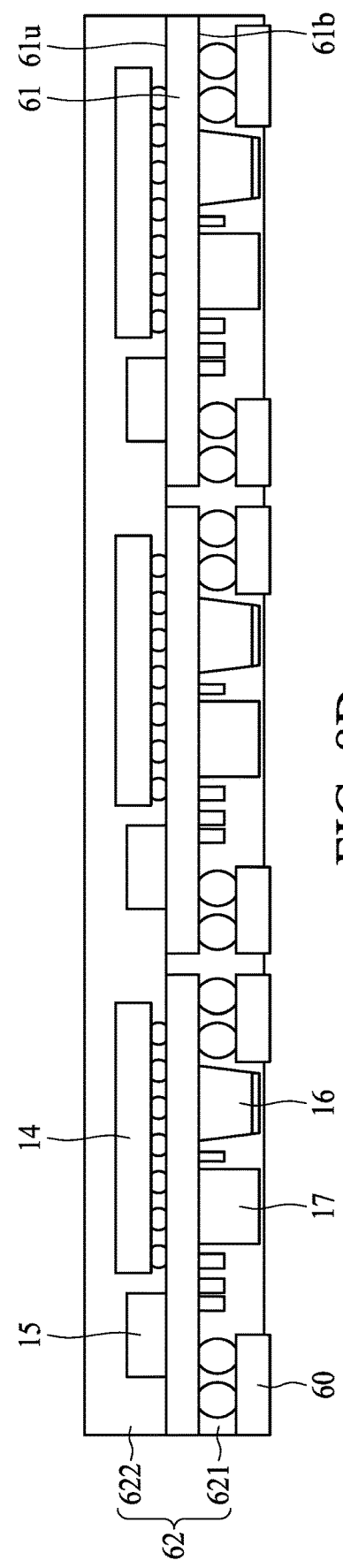
FIG. 8D illustrates a method of manufacturing a comparative semiconductor device package.

Referring to FIG. 8D, a second molding operation is performed. The substrate 61 and the electronic components 14 and 15 are encapsulated by an encapsulant 622. An encapsulant 62 including the encapsulant 621 and the encapsulant 622 encapsulates the substrate 60, the substrate 61, and the electronic components 14, 15, 16, and 17. Subsequently, a singulation operation is performed. The lower surface 60b of the substrate 10 is higher than a lower surface of the encapsulant 62.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. For example, "substantially parallel" can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially perpendicular" can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a first substrate having a first surface and a second surface opposite to the first surface, the first substrate defining a space;
   a second substrate adjacent to the first surface of the first substrate and covering the space;
   a first electronic component disposed on a first surface of the second substrate;
   a second electronic component disposed on a second surface of the second substrate and disposed in the space; and
   an encapsulant encapsulating the first substrate, the second electronic component and the second substrate, wherein the encapsulant covers the second surface of the first substrate, the first substrate includes a solder resist layer disposed on the second surface of the first substrate, and the encapsulant covers the solder resist layer,
   wherein the second substrate includes a lateral surface extending from the first surface of the second substrate to the second surface of the second substrate, the encapsulant is a nonconductive material, and the encapsulant is in contact with the lateral surface of the second substrate,
   wherein the first substrate includes a grounding layer embedded in the first substrate, and wherein a portion of the grounding layer is exposed from an outer surface of the first substrate extending from the first surface of the first substrate and a second surface of the first substrate.

2. The semiconductor device package of claim 1, further comprising a conductive layer disposed on the encapsulant and the outer surface of the first substrate and in contact with the grounding layer.

3. A semiconductor device package, comprising:
   a first substrate having a first surface and a second surface opposite to the first surface, the first substrate defining a space;
   a second substrate adjacent to the first surface of the first substrate and covering the space;
   a first electronic component disposed on a first surface of the second substrate;
   a second electronic component disposed on a second surface of the second substrate and disposed in the space;
   an encapsulant encapsulating the first substrate, the second electronic component and the second substrate, wherein the encapsulant covers the second surface of the first substrate, the first substrate includes a solder resist layer disposed on the second surface of the first substrate, and the encapsulant covers the solder resist layer; and
   a conductive pad disposed on the second surface of the first substrate, wherein the conductive pad is exposed from the encapsulant.

4. The semiconductor device package of claim 3, wherein the conductive pad includes a solder bump.

5. The semiconductor device package of claim 3, wherein the first substrate includes a first lateral surface, a second lateral surface, a third lateral surface and a fourth lateral surface, wherein the second surface of the first substrate includes a first lower surface and a second lower surface, and wherein the first lower surface is inclined from the first lateral surface to the second lateral surface, and the second lower surface is inclined from the second lateral surface to the fourth lateral surface.

6. The semiconductor device package of claim 5, wherein the first lower surface of the first substrate and the second lower surface of the first substrate are inclined relative to the space.

7. The semiconductor device package of claim 6, wherein a central portion of the first substrate is closer to the second substrate than is a peripheral portion of the first substrate.

8. The semiconductor device package of claim 5, wherein the first lower surface is separated from the second lower surface by the second electronic component and the encapsulant.

9. A semiconductor device package, comprising:
   a first substrate;
   a second substrate disposed under the first substrate, the second substrate including a first surface facing to the first substrate and a second surface opposite to the first surface; and an encapsulant encapsulating the second substrate, wherein the encapsulant is in contact with the first surface and the second surface of the second substrate, the second substrate includes a conductive pad exposed from the encapsulant, the second substrate includes a solder resist layer disposed on the second surface, and the encapsulant covers the solder resist layer.

10. The semiconductor device package of claim 9, wherein the second substrate includes a lateral surface extending from the first surface to the second surface, the encapsulant includes a lateral surface, the lateral surface of the second substrate is substantially coplanar with the lateral surface of the encapsulant.

11. The semiconductor device package of claim 9, wherein the encapsulant separates the second substrate into a first part and a second part in a cross-sectional view.

12. A semiconductor device package, comprising:
a first substrate having a first surface and a second surface opposite to the first surface, the first substrate defining a space;
a second substrate adjacent to the first surface of the first substrate and covering the space;
a first electronic component disposed on a first surface of the second substrate;
a second electronic component disposed on a second surface of the second substrate and disposed in the space; and
an encapsulant encapsulating the first substrate, the second electronic component and the second substrate,
wherein the encapsulant covers the second surface of the first substrate, the first substrate includes a solder resist layer disposed on the second surface of the first substrate, and the encapsulant covers the solder resist layer,
wherein the second substrate includes a lateral surface extending from the first surface of the second substrate to the second surface of the second substrate, the encapsulant is a nonconductive material, and the encapsulant is in contact with the lateral surface of the second substrate,
wherein the first substrate includes a lateral surface extending from the first surface of the first substrate to the second surface of the first substrate, and wherein the encapsulant includes a lateral surface substantially coplanar with the lateral surface of the first substrate.

13. A semiconductor device package, comprising:
a first substrate having a first surface and a second surface opposite to the first surface, the first substrate defining a space;
a second substrate adjacent to the first surface of the first substrate and covering the space;
a first electronic component disposed on a first surface of the second substrate;
a second electronic component disposed on a second surface of the second substrate and disposed in the space; and
an encapsulant encapsulating the first substrate, the second electronic component and the second substrate,
wherein the encapsulant covers the second surface of the first substrate, the first substrate includes a solder resist layer disposed on the second surface of the first substrate, and the encapsulant covers the solder resist layer,
wherein the second substrate includes a lateral surface extending from the first surface of the second substrate to the second surface of the second substrate, the encapsulant is a nonconductive material, and the encapsulant is in contact with the lateral surface of the second substrate,
wherein a portion of the second surface of the first substrate is exposed from the encapsulant.

* * * * *